(12) United States Patent
Okayama et al.

(10) Patent No.: US 9,034,124 B2
(45) Date of Patent: *May 19, 2015

(54) METHOD FOR PRODUCING METAL LAMINATED SUBSTRATE FOR OXIDE SUPERCONDUCTING WIRE, AND OXIDE SUPERCONDUCTING WIRE USING THE SUBSTRATE

(75) Inventors: Hironao Okayama, Kudamatsu (JP); Akira Kaneko, Kudamatsu (JP); Takeshi Kato, Osaka (JP); Masaya Konishi, Osaka (JP)

(73) Assignees: TOYO KOHAN CO., LTD., Tokyo (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 42 days.

This patent is subject to a terminal disclaimer.

(21) Appl. No.: 13/127,928

(22) PCT Filed: Nov. 11, 2009

(86) PCT No.: PCT/JP2009/006018
§ 371 (c)(1),
(2), (4) Date: Nov. 1, 2011

(87) PCT Pub. No.: WO2010/055651
PCT Pub. Date: May 20, 2010

(65) Prior Publication Data
US 2012/0040840 A1    Feb. 16, 2012

(30) Foreign Application Priority Data
Nov. 12, 2008    (JP) .................... 2008-290308

(51) Int. Cl.
*H01B 12/02*    (2006.01)
*H01L 39/24*    (2006.01)

(52) U.S. Cl.
CPC .................... *H01L 39/2454* (2013.01)

(58) Field of Classification Search
USPC .......................................... 148/518
See application file for complete search history.

(56) References Cited

U.S. PATENT DOCUMENTS 3,587,956 A    6/1971    Oelke
3,601,830 A    8/1971    Stover
(Continued)

FOREIGN PATENT DOCUMENTS

JP    2001110255 A    4/2001
JP    2003193211 A  *  7/2003 ................ C22F 1/08
(Continued)

OTHER PUBLICATIONS

Machine translation of JP2003193211, 2003.*
(Continued)

*Primary Examiner* — Rebecca Lee
(74) *Attorney, Agent, or Firm* — Browdy and Neimark, PLLC (57) ABSTRACT

A metal laminated substrate for an oxide superconducting wire is manufactured such that a non-magnetic metal plate T1 having a thickness of not more than 0.2 mm and a metal foil T2 made of Cu alloy which is formed by cold rolling at a draft of not less than 90% and has a thickness of not more than 50 µm is laminated to each other by room-temperature surface active bonding, after lamination, crystal of the metal foil is oriented by heat treatment at a temperature of not less than 150° C. and not more than 1000° C. and, thereafter, an epitaxial growth film T3 made of Ni or an Ni alloy having a thickness of not more than 10 µm is laminated to the metal foil.

9 Claims, 3 Drawing Sheets

(56) References Cited

U.S. PATENT DOCUMENTS

2008/0136751 A1 * 6/2008 Voutsas ............................ 345/76
2008/0261072 A1 * 10/2008 Kashima et al. ............... 428/677

FOREIGN PATENT DOCUMENTS

| JP | 2004243702 A * | 9/2004 | ............ B32B 15/08 |
| JP | 2006127847 A | 5/2006 | |
| JP | 2006286212 A | 10/2006 | |
| JP | 2007200831 A | 8/2007 | |
| JP | 2008210600 A | 9/2008 | |
| WO | WO 2004088677 A1 | 10/2004 | |

OTHER PUBLICATIONS

Machine translation of JP 2004243702, 2004.*
Machine translation of JP 2006286212, 2006.*

* cited by examiner

METHOD FOR PRODUCING METAL LAMINATED SUBSTRATE FOR OXIDE SUPERCONDUCTING WIRE, AND OXIDE SUPERCONDUCTING WIRE USING THE SUBSTRATE

TECHNICAL FIELD

The present invention relates to a method for manufacturing a film forming oriented substrate and a superconducting wire, and more particularly to a method for manufacturing a film forming oriented substrate for an oxide superconducting wire and a superconducting wire where a superconducting film is formed on the film forming oriented substrate manufactured by the manufacturing method.

BACKGROUND ART

To obtain an excellent high-temperature superconducting wire, it is necessary to form a superconducting film having high orientation on a substrate.

For this end, conventionally, with respect to the manufacture of an oxide superconducting wire, particularly, a Y-based oxide superconducting wire, there has been known the Y-based oxide superconducting wire which is manufactured as follows. As described in patent documents 1 to 3 and non-patent document 1, as an intermediate layer, an oxide layer such as a cerium oxide ($CeO_2$) layer, a stabilized zirconia (YSZ) layer or an yttrium oxide ($Y_2O_2$) layer is grown on and is laminated to a biaxially-crystal-oriented metal substrate by an epitaxial growth using a sputtering method. Then, an oxide superconducting body layer such as the Y123 thin film is grown on and is laminated to the oxide layer by an epitaxial growth using a laser abrasion method or the like, and an Ag layer or a Cu layer is laminated to the superconducting body layer as a protective film (RABITs method).

It has been also known that, for the acquisition of excellent superconducting wires using the above-mentioned RABITS method, it is important that the above-mentioned metal substrate is highly biaxially oriented.

Further, such a superconducting body is applicable to AC apparatuses or AC applications such as cables, coils and magnets. In view of a state where the superconducting body is manufactured by a reel-to-reel method in order to form the superconducting body into a tape shape or an elongated shape or an intermediate layer or a superconducting body layer are formed as a film at a high temperature of 600° C. or more, the above-mentioned metal substrate is required to satisfy conditions that the metal substrate has high strength, and has various properties which are uniform in the longitudinal direction and the like.

Further, in a case where the superconducting wire is used in the AC cable application or is used in a high magnetic field, when the wire is formed of a magnetic body, a current loss becomes large when an AC current is used thus giving rise to a drawback that the superconducting property is deteriorated. Accordingly, it is necessary to make the above-mentioned metal substrate have weak magnetic property or non-magnetic property.

As a method for highly biaxially orienting the above-mentioned metal substrate, in general, there has been known a method in which the metal substrate is subject to cold rolling at a draft of 90% or more thus giving a large uniform strain to the whole material and, thereafter, the metal substrate is recrystallized by heat treatment thus obtaining the highly biaxially oriented metal substrate. Particularly, it has been known that Ni, Cu or an alloy of these metals exhibits the high biaxial crystal orientation.

Particularly, because of its high strength compared to Cu and its affinity with an intermediate layer and the like, Ni has been widely used from an early stage of development of the biaxially oriented substrate. However, there still remains a drawback that material strength of crystal-oriented Ni is low, that is, 30 MPa in terms of yield stress and, further, the biaxial orientation of pure Ni is approximately 10° in terms of a half value width ($\Delta\phi$) of a $\phi$ scan peak ($\alpha=45°$) in a pole figure by an X-ray diffraction which becomes an index.

Accordingly, to improve the biaxial crystal orientation of a pure Ni layer, there has been proposed a method (SOE method) in which NiO is formed by oxidizing a surface of the pure Ni layer at a high temperature so that the degree of biaxial crystal orientation is improved. However, there still remains a drawback that the biaxial orientation is approximately 8° in terms of $\Delta\phi$ or the method requires heat treatment which takes a relatively long time at a high temperature of 1000° C. or more and hence, the number of steps is increased and a cost is pushed up whereby the method is uneconomical.

Further, as the metal substrate, there has been proposed an Ni—W alloy where 3% to 9% of W is added to Ni, wherein the Ni—W alloy is developed by taking strength and biaxial crystal orientation into consideration. The Ni—W alloy exhibits the higher biaxial crystal orientation than pure Ni and the biaxial orientation is 7° or less in terms of $\Delta\phi$.

The strength of the Ni—W alloy is improved compared to the strength of the pure Ni, that is, yield stress of the Ni—W alloy is enhanced to 195 MPa. However, the Ni—W alloy does not exhibit the sufficient strength necessary in handling during conveyance by a reel-to-reel method at a high temperature at the time of forming an intermediate layer as a film. That is, the handling of the metal substrate made of the Ni—W alloy is not easy.

Further, to secure the strength of the metal substrate, a thickness of the metal substrate cannot be decreased to a value less than 100 μm so that there arises a drawback that a cost cannot be decreased.

Further, Ni and Ni—W alloy are ferromagnetic and hence, when these materials are used for producing the metal substrate, due to the restriction that a thickness of the metal substrate cannot be decreased from a viewpoint of ensuring strength, a current loss becomes large in AC applications. Further, even when a superconducting body layer which possesses the favorable crystal orientation can be laminated to the metal substrate, the metal substrate cannot acquire sufficient superconducting property.

Further, the above-mentioned Ni—W alloy is not a popularly used material, is difficult to obtain, exhibits poor workability so that the manufacture of the substrate having a large width is difficult, exhibits poor productivity, and is expensive.

Further, as a material for forming a metal substrate which can overcome a problem on ensuring strength other than an Ni alloy, there has been proposed a clad material which is formed by laminating a metal core layer and an Ni alloy layer by cold drawing or by a cold rolling method (patent documents 4, 5, 6).

Patent document 1: Patent 3601830
Patent document 2: Patent 3587956
Patent document 3: WO2004/088677 brochure
Patent document 4: JP-A-2006-286212
Patent document 5: JP-A-2007-200831
Patent document 6: JP-A-2001-110255
Non-patent document 1: D. P. Norton et al., Science vol. 274 (1996)755

To laminate different kinds of metals with favorable adhesion by a cold rolling method, it is necessary to bond different kinds of metals to each other by diffusion bonding (diffusion heat treatment) as the pretreatment and, thereafter, to apply cold rolling to the bonded metals. Although working efficiency of 90% or more is necessary to impart the high crystal orientation to an Ni layer after diffusion heat treatment, when strong rolling is applied to the different kinds of metals in a bonded state, due to the difference in mechanical properties between both materials, the difference in elongation occurs between the materials and hence, a large warp occurs. Accordingly, it is easy to expect that handling of materials becomes difficult in the manufacture of an elongated tape.

Further, in the above-mentioned clad material, materials to be bonded confine each other on a bonding boundary so that rolling is performed while causing the non-uniform deformation of the clad material whereby the uniform strain cannot be induced in the thickness direction. Further, the degree of roughness of the bonding boundary is also increased so that the thickness of the Ni layer in which crystals are oriented also becomes non-uniform. Accordingly, in the heat treatment after bonding, the stable manufacture of the substrate having the uniform and high crystal orientation in the longitudinal direction becomes difficult.

For example, a metal substrate disclosed in patent document 6 fails to set a crystal orientation rate of an Ni (200) surface parallel to a surface (assuming a diffraction peak intensity ratio of a (200) surface in θ/2θ measurement in X-ray diffraction as $I_{(200)}/\Sigma I_{(hkl)} \times 100(\%)$) to high crystal orientation of 99% or more.

Further, even when a superconducting body layer is laminated to the metal substrate, crystal current density is approximately $10^5$ A/cm$^2$ so that crystal current density of high value on the order of $10^6$ A/cm$^2$ cannot be obtained.

Due to the above-mentioned reasons, at present, it is difficult to expect the further enhancement of superconductive property of elongated clad metal substrates which are proposed in patent documents 4, 5 and 6.

As other materials which exhibit the excellent crystal orientation property other than Ni, Cu and a Cu alloy can be named. Cu has characteristics that Cu is a face-centered cubic lattice and non-magnetic in the same manner as Ni, has the recrystallization temperature of approximately 200° C., and exhibits the crystal orientation at a low temperature. However, Cu is a low-strength material so that Cu has not been used positively.

DISCLOSURE OF THE INVENTION

Problems that the Invention is to Solve

As has been explained heretofore, although an Ni—W alloy constitutes a mainstream with respect to a biaxially oriented metal substrate used in a RABITS method, the Ni—W alloy has drawbacks such as the possession of magnetic property, a still insufficient mechanical strength of approximately 200 MPa in terms of a yield stress, a high manufacturing cost, and poor workability.

Further, although a clad material made of Ni or an Ni alloy and a kind of metal different from Ni or an Ni alloy and manufactured by cold drawing or a cold rolling method achieves high strength, the clad material has drawbacks that the clad material is inferior to an Ni—W alloy in biaxial crystal orientation and the uniform and high performance in the longitudinal direction cannot be achieved.

The present invention has been made to overcome all of the above-mentioned drawbacks, and it is an object of the present invention to provide a manufacturing method of a metal laminated substrate for an oxide superconducting wire which has a surface having the substantially same or higher biaxial crystal orientation obtained by the above-mentioned Ni—W alloy, has high strength, and enables the simple and inexpensive manufacture of an elongated tape.

Further, it is another object of the present invention to provide an oxide superconducting wire which uses the metal laminated substrate.

Means for Solving the Problems (1) A manufacturing method of a metal laminated substrate for an oxide superconducting wire includes the steps of: laminating a non-magnetic metal plate and a metal foil made of Cu or a Cu alloy to which cold rolling is applied at a high draft by surface active bonding; biaxially orienting crystal of the metal foil by heat treatment after lamination; and applying an epitaxial growth film made of Ni or an Ni alloy to a surface of the metal foil.

(2) In the manufacturing method of a metal laminated substrate for an oxide superconducting wire described in (1), the non-magnetic metal plate has a thickness of not less than 0.05 mm and not more than 0.2 mm.

(3) In the manufacturing method of a metal laminated substrate for an oxide superconducting wire described in (1), a metal foil which is formed by cold rolling at a draft of not less than 90% and has a thickness of not less than 7 μm and not more than 50 μm is used as the metal foil made of Cu or the Cu alloy.

(4) In the manufacturing method of a metal laminated substrate for an oxide superconducting wire described in (1), the Cu alloy foil contains not less than 0.01% and not more than 1% of Ag, Sn, Zn, Zr, O and N in total.

(5) In the manufacturing method of a metal laminated substrate for an oxide superconducting wire described in (1), wherein the heat treatment after lamination is performed at a temperature of not less than 150° C. and not more than 1000° C.

(6) In the manufacturing method of a metal laminated substrate for an oxide superconducting wire described in (1), a film thickness of the Ni alloy is not less than 0.5 μm and not more than 10 μm.

(7) In the manufacturing method of a metal laminated substrate for an oxide superconducting wire described in (1), before the heat treatment, polish treatment is applied to the metal foil such that the surface roughness of a surface of the metal foil becomes not less than 1 nm and not more than 40 nm by Ra.

(8) An oxide superconducting wire according to the present invention uses the metal laminated substrate manufactured by the manufacturing method of a metal laminated substrate for an oxide superconducting wire described in any one of claims 1 to 7.

Advantageous Effects of the Invention

A present situation is that oxide superconducting wires have been manufactured with a width of 4 mm to 10 mm in many cases, and an Ni alloy of a conventional crystal oriented metal plate, a clad material formed by a cold rolling method and the like exhibit poor workability and hence, an elongated coil having a large width and stable crystal orientation cannot be manufactured. According to the manufacturing method of the present invention, it is possible to manufacture a substrate for a superconducting wire which is an elongated coil having a large width, has high strength, and has stable high crystal orientation in the longitudinal direction. Further, according to the manufacturing method of the present invention, it is possible to manufacture several tens of substrates for an oxide superconducting wire which are elongated coils at a time by slit working so that the manufacturing method is advantageous in terms of manufacturing cost.

Further, with the use of surface activation bonding method at a room temperature, a commercially available non-magnetic metal plate which is manufactured with an accurate thickness in advance and a high draft rolled Cu foil or a high draft rolled Cu alloy foil which is provided for acquiring a metal crystal orientation surface can be laminated to each other at a low draft and with high accuracy whereby it is possible to manufacture the metal laminated plate having the favorable accuracy in thickness and a large width as an elongated coil.

BEST MODE FOR CARRYING OUT THE INVENTION

Figure 1:
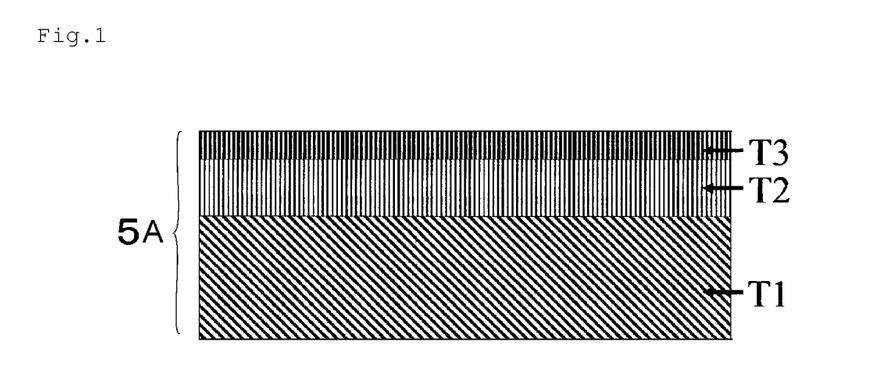
FIG. 1 A schematic cross-sectional view showing the constitution of a metal laminated substrate 5A for an oxide superconducting wire obtained by carrying out a manufacturing method of the present invention.

FIG. 1 is a schematic cross-sectional view showing the constitution of a metal laminated substrate 5A for an oxide superconducting wire obtained by the manufacturing method of the present invention.

As shown in FIG. 1, the metal laminated substrate 5A for an oxide superconducting wire obtained using a manufacturing method of the present invention is constituted of a non-magnetic metal plate T1 which constitutes a metal substrate, a metal foil T2 which is laminated to the non-magnetic metal plate T1, and an epitaxial growth film T3 applied to the metal foil T2.

The reason that an Ni film which constitutes the epitaxial growth film T3 is formed on the metal foil T2 is that the Ni film has more favorable anti oxidation unoxidization compared to Cu (metal foil T2), and unless an Ni layer is provided on Cu, there exists a possibility that a Cu oxide film is formed at the time of forming an intermediate layer such as a $CeO_2$ layer so that the orientation of the metal foil T2 may collapse.

Further, it is preferable to set a thickness of the non-magnetic metal plate T1 to not less than 0.05 mm and not more than 0.2 mm. The reason that the thickness of the non-magnetic metal plate T1 is set to not less than 0.05 mm is to secure strength of the non-magnetic metal plate T1, and the reason the thickness of the non-magnetic metal plate T1 is set to not more than 0.2 mm is to secure workability at the time of working a superconducting material.

It is preferable that the metal foil T2 is made of Cu or a Cu alloy (both Cu and a Cu alloy also referred to as a Cu alloy in some cases in this specification) which is formed by cold rolling at a draft of not less than 90%, and has a thickness of not less than 7 μm and not more than 50 μm. When the draft is less than 90%, there is a possibility that Cu is not oriented in the post heat treatment. The reason the thickness of the metal foil T2 is set to not less than 7 μm is to secure strength of the metal foil T2, and the reason the thickness of the metal foil T2 is set to not more than 50 μm is to secure workability at the time of working a superconducting material using the metal foil T2.

It is preferable that the epitaxial growth film T3 is made of Ni or an Ni alloy (both Ni and an Ni alloy also referred to as an Ni alloy in some cases in this specification) which has a thickness of not less than 0.5 μm and not more than 10 μm. The reason the thickness of the epitaxial growth film T3 is set to not less than 0.5 μm is to prevent the diffusion of Cu, and the reason the thickness of the epitaxial growth film T3 is set to not more than 10 μm is that when the thickness of the epitaxial growth film T3 exceeds 10 μm, there exists a possibility that the orientation of epitaxial growth collapses.

The metal laminated substrate 5A for an oxide superconducting wire is manufactured such that the non-magnetic metal plate T1 and the metal foil T2 are laminated to each other by room-temperature surface activation bonding and, after such lamination, crystal of the metal foil T2 is biaxially oriented by heat treatment at a temperature of not less than 150° C. and not more than 1000° C. and, thereafter, the epitaxial growth film T3 is formed on a metal foil T2 side surface.

In the present invention, "non-magnetic" means a state where a substance is not a ferromagnetic substance at a temperature of 77K or more, that is, a Curie point or a Neel point of the substance exists at a temperature of 77K or below and the substance is a paramagnetic substance or an antiferromagnetic substance at a temperature of 77K or more.

As the nonmagnetic metal plate used in the present invention, an austenite-based stainless steel plate is preferably used since the austenite-based stainless steel plate plays a role of a reinforcing material having excellent strength.

In general, although austenite-based stainless steel is in a nonmagnetic state, that is, in a state where the metal structure is 100% austenite (γ) at a room temperature, when a phase transformation point (Ms point) of a martensite (α') which is ferromagnetic is positioned at a temperature of 77K or more, there exists a possibility that an α' phase which is ferromagnetic at a liquid nitrogen temperature appears.

Accordingly, the austenite-based stainless steel plate whose Ms point is designed at a temperature of 77K or below is preferably used as an oxide superconducting wire used below a liquid nitrogen temperature (77K).

Further, in forming a cable by twisting the above-mentioned oxide superconducting wire, the metal laminated substrate 5A for an oxide superconducting wire is subject to slit working. Here, there exists a possibility that a working portion is transformed into an α' phase in the stainless steel having a pseudo stable γ phase.

From such a viewpoint, as a γ-based stainless steel plate to be used, it is desirable to use a plate material such as SUS316 or SUS316L which have a stable γ phase with an Ms point designed to be sufficiently lower than a temperature of 77K, are popularly used and are available at a relatively low cost. Although the stainless steel plate having a thickness of not less than 20 μm is commercially available, to take the formation of the oxide superconducting wire as a foil and the strength of the stainless steel plate into consideration, it is desirable to set the thickness of the stainless steel plate to not less than 50 μm and not more than 100 μm.

The metal foil used in the present invention is formed such that an intermediate layer is laminated to a surface of the metal foil, and a superconducting body layer is laminated to the intermediate layer by an epitaxial growth. Accordingly, it is necessary to impart the high crystal orientation to the metal foil in a state where the laminated substrate is formed.

The crystal orientation is controlled by heat treatment after surface activation bonding and hence, it is necessary to uniformly apply heavy working to the whole surface of the plate at a draft of not less than 90% before and after bonding.

Such a high-reduction rolled Cu alloy foil has been developed for imparting high bending property to the foil aiming at the use in a flexible printed circuit board and has become wide spread, and can be easily obtained last few years. For example, a high-reduction rolled Cu foil (product name: HA foil) made by Nikko Materials Ltd, a high-reduction rolled Cu foil (product name: HA foil) made by Hitachi Electric Wires., Ltd and the like are named.

In the present invention, it is desirable to use the above-mentioned commercially available high-reduction rolled Cu alloy foil since these foils exhibit the excellent crystal orientation. Although the smaller a thickness of the foil, the more economical the foil becomes, it is desirable to use the currently available foil having a thickness of not less than 7 μm and not more than 35 μm. It is more desirable to use the currently available foil having a thickness of not less than 12 μm and not more than 18 μm.

Although any element may be used as an element to be added to the Cu alloy foil provided that the element allows the Cu alloy foil to easily elevate a (200) surface crystal orientation rate to not less than 99% by heat treatment, trace amounts of Ag, Sn, Zn, Zr, O, N are added to the Cu alloy foil respectively, wherein a total amount of these element is set to not more than 1%.

The reason that the total amount of elements to be added is set to not more than 1% is that although the elements to be added and Cu form a solid solution, when the total amount of elements to be added exceeds 1%, there exists a possibility that impurities such as oxides other than solid solution are increased and the impurities influence the orientation. Accordingly, it is preferable to set the total amount of elements to be added to not more than 0.1%.

The austenite-based stainless steel plate and the Cu alloy foil formed by cold rolling at a draft of 90% or more which are explained heretofore are laminated to each other by a surface activation bonding method.

Figure 5:
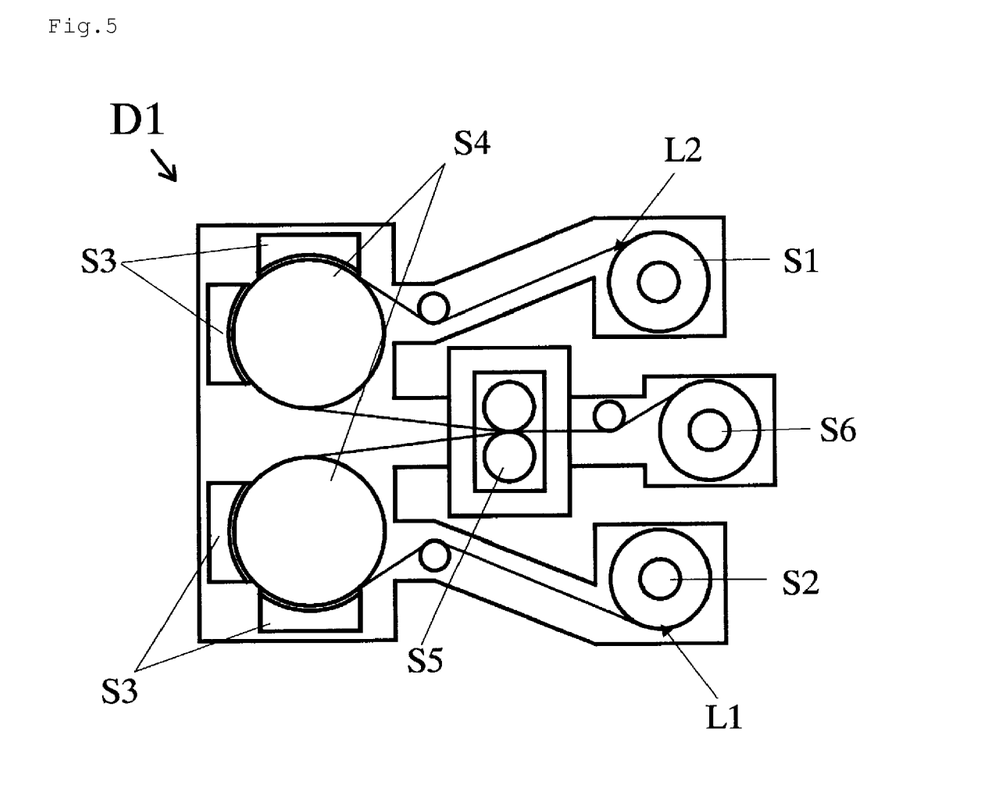
FIG. 5 A schematic view of a surface activation bonding device D1 used in the present invention.

As the above-mentioned surface activation bonding method, for example, a vacuum surface activation bonding device D1 shown in FIG. 5 can be used.

As shown in FIG. 5, a nonmagnetic metal plate L1 and a Cu alloy foil L2 are prepared as elongated coils having a width of 150 mm to 600 mm, and are mounted on recoiler portions S1, S2 of the vacuum surface activation bonding device D1.

The nonmagnetic metal plate L1 and the Cu alloy foil L2 which are conveyed from the recoiler portions S1, S2 are continuously conveyed to a surface activation treatment step where activation treatment is applied to two surfaces to be bonded in advance and, thereafter, the nonmagnetic metal plate L1 and the recoiler portions S1, S2 are brought into pressure contact by cold rolling at a draft of 0.1 to 5%.

In the surface activation treatment step, the surface activation treatment is performed by sputter etching treatment in an extremely-low-pressure inert gas atmosphere of 10 to $1 \times 10^{-2}$ Pa, wherein the nonmagnetic metal plate L1 and the Cu alloy foil L2 having bonding surfaces are used as one electrodes A (S3) which are connected to a ground respectively, a glow discharge is generated by applying an AC current of 1 to 50 MHz between one electrodes A and the other electrodes B (S4) which are supported in an insulated manner, and an area of the electrode which is exposed in plasma generated by the glow discharge is not more than 1/3 of an area of the electrodes B.

As an inert gas, argon, neon, xenon, krypton or a mixture gas containing at least one kind selected from a group consisting of these gases is applicable.

In the sputter etching treatment, surfaces of the nonmagnetic metal plate L1 and the Cu alloy foil L2 which are bonded to each other are subjected to sputtering by an inert gas so that surface absorption layers and surface oxide films are removed whereby bonding surfaces are activated. During this sputter etching treatment, the electrodes A (S3) take the form of cooling rolls thus preventing the elevation of temperatures of respective materials to be conveyed.

Thereafter, the nonmagnetic metal plate L1 and the Cu alloy foil L2 are continuously conveyed to a pressure bonding roll step (S5) so that the activated surfaces are pressure-bonded to each other. When an $O_2$ gas or the like exists in the pressure bonding atmosphere, the activation processed surfaces are oxidized again during the conveyance and hence, the pressure bonding atmosphere influences the adhesion between the nonmagnetic metal plate L1 and the Cu alloy foil L2. Accordingly, it is desirable to perform the pressure bonding roll step (S5) under a high vacuum of $1 \times 10^3$ Pa or less.

Further, the lower a draft, the more excellent the accuracy in thickness becomes and hence, it is preferable to set the draft to not more than 2%.

A laminated body formed by hermetically bonding the nonmagnetic metal plate L1 and the Cu alloy foil L2 to each other through the above-mentioned pressure bonding step is conveyed to a winding step (S6), and is wound in the step.

Next, after laminating the nonmagnetic metal plate L1 and the Cu alloy foil L2 to each other by the surface activation bonding method, heat treatment is applied to the laminated body so as to highly orient crystal of the high-reduction rolled Cu alloy foil. To allow the high-reduction rolled Cu alloy foil to finish the recrystallization completely, it is necessary to set a heat treatment temperature to a temperature of not less than 150° C. A soaking time may be approximately 10 seconds when the heat treatment is performed using a continuous annealing furnace.

When the heat treatment temperature is excessively high, the secondary recrystallization is liable to occur in the Cu foil or the rolled Cu alloy foil so that the crystal orientation is deteriorated. Accordingly, the heat treatment is performed with the heat treatment temperature of not less than 150° C. and not more than 1000° C.

By taking a state where the substrate is placed in the high temperature atmosphere of 600° C. to 900° C. in an intermediate layer forming step and a superconducting body layer forming step into consideration, it is preferable to perform the heat treatment at a temperature of 600° C. to 900° C.

In general, with respect to the crystal oriented metal substrate for the oxide superconducting wire, it is considered that the smaller the crystal grains, the more preferable the characteristics of the crystal oriented metal substrate become. In the rolled Cu alloy foil which is subjected to recrystallization due to the above-mentioned heat treatment, an average particle size is approximately 80 μm even when the heat treatment is performed at a heat treatment temperature of 1000° C. and hence, it is confirmed that the rolled Cu alloy foil possesses the favorable characteristics.

In this manner, after the heat treatment, it is possible to produce the metal laminated substrate formed of the nonmagnetic metal plate and the Cu alloy foil which has high strength and high crystal orientation. For example, the metal laminated substrate formed of the nonmagnetic metal plate and the Cu alloy foil is obtained in the following manner.

A high-reduction rolled Cu foil and a SUS316L plate having a thickness of 100 μm are bonded to each other by a room-temperature surface activation bonding method and, thereafter, the high-reduction rolled Cu foil and the SUS316L plate are subject to heat treatment at various temperatures thus manufacturing metal laminated substrate.

A high-reduction rolled Cu foil having a width of 200 mm and a thickness of 18 μm and a SUS316L plate having a width of 200 mm and a thickness of 100 μm are bonded to each other by a room-temperature surface activation bonding method and, thereafter, the high-reduction rolled Cu foil and the SUS316L plate are subject to heat treatment at a temperature of 200° C. to 1000° C. for five minutes to manufacture a metal laminated substrate. Results of following measurements are collectively shown in Table 1.

(1) Crystal orientation rate: rate at which a Cu (200) surface is made parallel to a Cu foil surface.

(2) An index value indicating that the (200) surface is parallel to the longitudinal direction <001>

Here, the crystal orientation rate indicates a (200) surface strength rate at a θ/2θ diffraction peak measured by X-ray diffraction, while the index value indicates a Δφ(°) (φ scan peak (an average value of half value widths of 4 peaks at) α=35° obtained by an Ni (111) pole figure in accordance with X-ray diffraction) as a biaxial orientation index.

As comparison examples, peak strength rates when the heat treatment is performed at a temperature of 130° C. and 1050° C. are also shown.

Further, for a comparison purpose, Table 1 also shows a peak strength rate when a high-reduction rolled Ni foil having a thickness of 30 μm is bonded instead of the Cu foil by the above-mentioned room-temperature activation bonding method and, thereafter, heat treatment is applied to the high-reduction rolled Ni foil at a temperature of 1000° C. for 1 hour.

The following is understood from Table 1.

In the high-reduction rolled Cu foil, the crystal orientation rate is 93% when the heat treatment is performed at a heat treatment temperature of 130° C. for 5 minutes and hence, the crystal orientation rate is not sufficient yet. However, when the heat treatment temperature falls within a range from 200° C. to 1000° C., the (200) surface crystal orientation rate becomes 99% or more when such a heat treatment temperature is held for 5 minutes.

Further, when the heat treatment temperature exceeds 1000° C., the uniaxial orientation of the (200) surface collapses due to the secondary recrystallization so that the strength rate is lowered to 70%.

In case of Ni, the recrystallization temperature is around 700° C. so that the strength rate is 98% even with the heat treatment at a temperature of 1000° C. which is considered as the optimum heat treatment temperature whereby the strength rate does not reach 99% and Δφ is also 15.4°.

Further, it is confirmed that the crystal orientation degree, that is, Δφ indicative of the biaxial orientation becomes not more than 6° in all embodiments.

This value is an average of values measured at three points consisting of areas in the vicinity of both ends of the plate and the center of the plate having a size of 200 mm in the widthwise direction, and no difference is substantially recognized with respect to the value among the embodiments.

TABLE 1

| Experimental example | Sample | Heat treatment temperature (° C.) | Crystal orientation rate (%) | Δφ (°) |
|---|---|---|---|---|
| Comparison experimental example 1-1 | Cu/SUS316L | 130 | 93.0 | Not measured |
| Experimental example 1-1 | | 200 | 99.8 | 6.0 |
| Experimental example 1-2 | | 300 | 99.9 | 6.0 |
| Experimental example 1-3 | | 500 | 99.9 | 5.8 |
| Experimental example 1-4 | | 700 | 100.0 | 5.8 |
| Experimental example 1-5 | | 800 | 100.0 | 5.6 |
| Experimental example 1-6 | | 900 | 100.0 | 5.4 |
| Experimental example 1-7 | | 1000 | 99.0 | 5.3 |
| Comparison experimental example 1-2 | | 1050 | 70.5 | Not measured |
| Comparison experimental example 1-3 | Ni/SUS316L | 1000 | 98.4 | 15.4 |

However, the high-crystal oriented surface is formed of the Cu alloy foil and hence, depending on a kind of the intermediate layer which is formed on the surface of the Cu alloy foil, there exists a possibility that the close contact cannot be secured due to the Cu oxidization or the like.

According to the present invention, an Ni alloy film is formed on a Cu foil side surface of the metal laminated substrate by an epitaxial growth.

Cu and Ni are elements which are arranged next to each other in an element periodic table, have the same face-centered cubic lattice in the metal crystal structure, and have lattice constants which are close to each other. It is known that Cu and Ni are liable to generate an epitaxial growth respectively.

As a method of forming an Ni alloy film, various methods including an electrolytic plating method, a non-electrolytic plating method, a vacuum vapor deposition method and a sputtering method can be named. To particularly take the continuous treatment of an elongated coil with high efficiency into consideration, it is preferable to form the Ni alloy film using the electrolytic plating method.

A film thickness of the Ni alloy is set to not less than 0.5 μm and not more than 10 μm by taking the prevention of diffusion of Cu at the time of forming an oxide intermediate layer or a superconducting body layer which are performed later, magnetism which Ni possesses, the collapse of crystal orientation when an epitaxial growth exceeds 10 μm, and a role of a protective film which is the prevention of the diffusion of Cu at a high temperature or the like into consideration. It is preferable to set the film thickness of the Ni alloy to not less than 0.5 μm and not more than 3 μm.

The crystal orientation of the Ni epitaxial growth film on the high crystal orientation Cu surface is enhanced more compared to the crystal orientation (Δφ: approximately 8°) of Ni obtained by conventional rolling and annealing. That is, Ni epitaxial growth film can acquire the high crystal orientation substantially equal to or more than the crystal orientation of an Ni—W alloy (Δφ≤7°).

As elements which are contained in the Ni alloy to be formed as a film, it is preferable to use an element which decreases magnetism of the Ni alloy. Particularly, elements such as Cu, Sn, W, Cr can be named.

Next, the roughness of the crystal oriented surface of the metal substrate for the oxide superconducting wire is explained.

The lower the surface roughness Ra of the Cu alloy foil used in the metal substrate for the oxide superconducting wire, the more the crystal orientation of the oxide intermediate layer and the superconducting body layer is improved so that the superconductive property of the oxide intermediate layer and the superconducting body layer is enhanced. Accordingly, in a case of the Cu alloy foil whose surface roughness Ra is 100 nm or more, after surface activation bonding, the treatment which adjusts the surface roughness Ra to not more than 40 nm is performed.

As a method of lowering the surface roughness, draft using pressure rolls, buffing, electrolytic polishing, an electrolytic abrasive grain polishing and the like are considered. However, any method can be used. Although it is desirable to set the surface roughness to a mirror surface level, by taking a currently available technique and an economic aspect into consideration, it is desirable to set the surface roughness Ra to not less than 1 nm and not more than 10 nm.

By performing the above-mentioned surface roughness adjustment, it is possible to acquire the more excellent substrate and hence, it is possible to acquire the high performance oxide superconducting wire.

Figure 3:
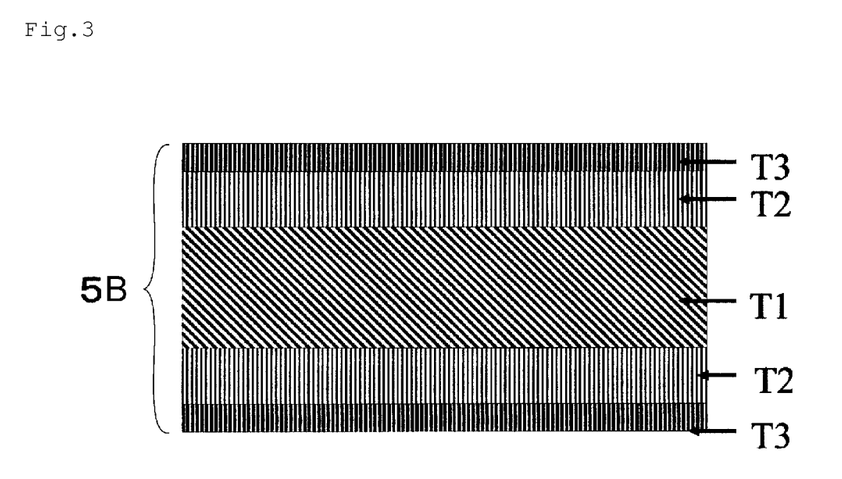
FIG. 3 A view of a metal laminated plate 5B for an oxide superconducting wire obtained by a manufacturing method of the present invention showing a state where a Cu alloy foil T2 is laminated to both surfaces of a nonmagnetic metal plate T1 by surface active bonding and, after heat treatment, an epitaxial growth film T3 made of Ni alloy is applied to both surfaces.

FIG. 3 is a schematic cross-sectional view of a metal laminated plate for an oxide superconducting wire obtained by a manufacturing method of another embodiment of the present invention. That is, FIG. 3 shows the constitution of the metal laminated substrate 5B for an oxide superconducting wire which is formed in such a manner that a Cu alloy foil T2 is laminated to both surfaces of a nonmagnetic metal plate T1 by surface activation bonding and, after heat treatment, an epitaxial growth film T3 made of an Ni alloy is imparted to both surfaces of the Cu alloy foil T2.

Next, a method of manufacturing the oxide superconducting wire using the above-mentioned metal laminated plate for an oxide superconducting wire is explained.

Figure 2:
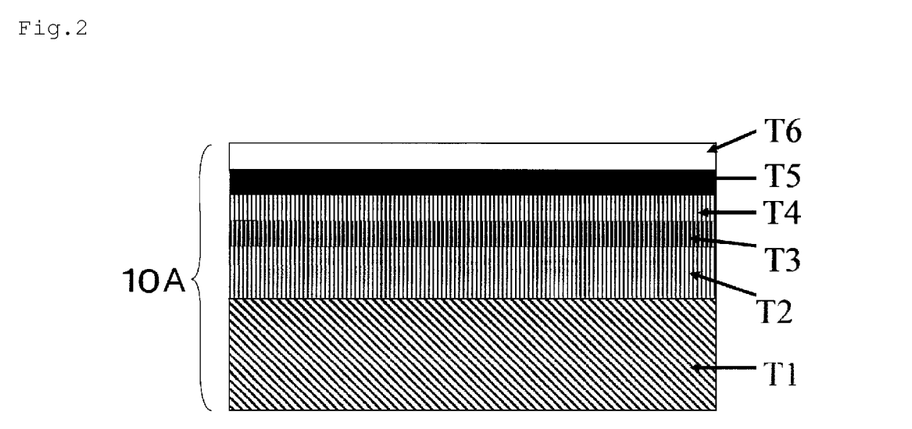
FIG. 2 A schematic cross-sectional view showing the constitution of an oxide superconducting wire 10A obtained by the manufacturing method of the present invention.

FIG. 2 is a schematic cross-sectional view showing the constitution of an oxide superconducting wire 10A which is formed by laminating an intermediate layer T4, an oxide superconducting body layer T5 and a protective film T6 on the metal laminated substrate 5A for an oxide superconducting wire shown in FIG. 1 in order.

The oxide superconducting wire 10A is manufactured in such a manner that an intermediate layer made of $CeO_2$, YSZ, $SrTiO_3$, MgO or the like is formed on the crystal oriented epitaxial growth film T3 epitaxially by a sputtering method or the like, the superconducting body layer such as a Y123-based thin film is formed by a laser abrasion method or the like, and an Ag layer, a Cu layer or the like is further laminated to the superconducting body layer as the protective film.

Figure 4:
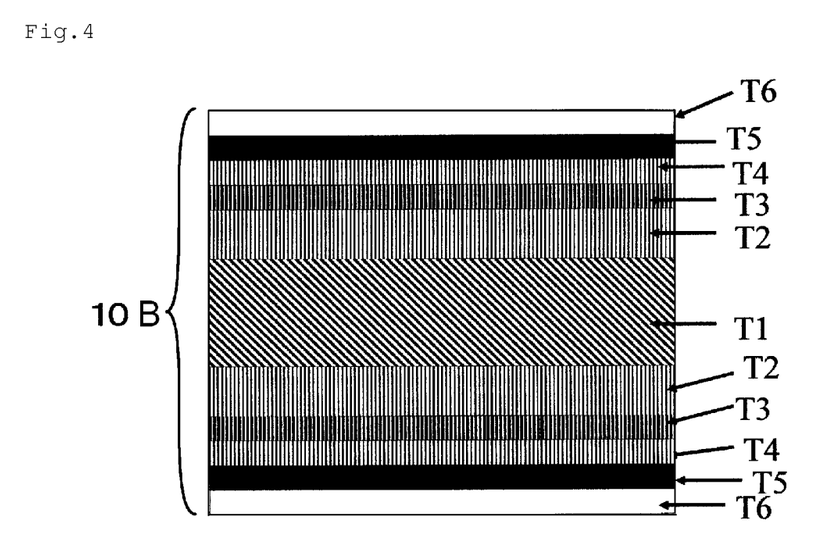
FIG. 4 A schematic cross-sectional view showing the constitution of the oxide superconducting wire 10B obtained by the manufacturing method of the present invention.

FIG. 4 is a schematic cross-sectional view showing the constitution of an oxide superconducting wire 10B showing another embodiment of the oxide superconducting wire of the present invention.

By manufacturing the superconducting wire using the metal laminated substrate for an oxide superconducting wire manufactured by the manufacturing method of the present invention, the following advantages are acquired.

a. The metal laminated substrate for an oxide superconducting wire possesses the high crystal orientation and hence, the intermediate layer and the superconducting body layer can also be easily formed by an epitaxial growth, and it is possible to manufacture the superconducting wire possessing high superconductive property, that is, high critical current density under a temperature of 77K which is a liquid nitrogen temperature.

b. The metal laminated substrate for an oxide superconducting wire possesses high strength and hence, handling in an intermediate layer forming step and a superconducting body layer forming step becomes easy.

c. The metal laminated substrate for an oxide superconducting wire substantially has no magnetism and hence, the metal laminated substrate can be used in AC applications where the use of an Ni—W alloy is difficult.

d. The metal laminated substrate for an oxide superconducting wire can be manufactured in the form of an elongated coil having a large width and hence, the oxide superconducting wire is manufactured using an elongated coil having a large width, and the elongated coil is subject to slit working in a final step thus manufacturing a wire as a finished product whereby the production efficiency can be enhanced.

Next, an embodiment of the manufacturing method of the present invention is exemplified, wherein properties of the manufactured metal laminated substrate for an oxide superconducting wire are explained.

Embodiment 1

A high-reduction rolled Cu foil having a width of 200 mm and a thickness of 18 μm and a SUS316L plate having a width of 200 mm and a thickness of 100 μm are bonded to each other by a room-temperature activation bonding method, the high-reduction rolled Cu foil and the SUS316L plate are subject to heat treatment by continuous annealing at a temperature of 800° C. (a soaking holding time: 5 minutes) and, thereafter, Ni plating is applied to the Cu foil by changing a film thickness thus acquiring metal laminated substrates for an oxide superconducting wire. Then, the substrate is subject to slit working thus forming tape-shaped samples having a width of 10 mm. Crystal orientation rates of Ni plating layers of the acquired metal laminated substrates for an oxide superconducting wire are measured.

The respective measurements are performed in accordance with the above-mentioned method with proper modification. The results of the measurements are shown in Table 2.

TABLE 2

| Embodiment comparison example | Sample | Ni plating thickness (μm) | Crystal orientation rate (%) | Δφ (°) |
|---|---|---|---|---|
| Embodiment 1-1 | Ni/Cu/SUS316L | 0.7 | 100 | 5.6 |
| Embodiment 1-2 | | 1.0 | 100 | 5.6 |
| Embodiment 1-3 | | 3.0 | 100 | 5.6 |
| Comparison example 1-1 | Ni/SUS316L | — | 98.4 | 15.4 |

The following can be understood from Table 2.

The Ni plating layer grows epitaxially on a surface of the highly (200) crystal-oriented Cu foil which constitutes a background, and the Ni plating layer assumes the same crystal orientation rate as the surface of the Cu foil. Even when the thickness of Ni plating layer is increased to 3 μm (embodiment 1-3), no change is recognized in the crystal orientation.

As a comparison example (comparison example 1-1), a crystal orientation rate of an Ni/SUS316L laminated metal substrate manufactured using a high-reduction rolled Ni foil having a thickness of 30 μm instead of the Cu foil (heat treatment performed at a temperature of 1000° C. for 1 hour after surface activation bonding) is shown.

In this case, although the favorable crystal orientation rate can be acquired by adopting the surface activation bonding method, the crystal orientation rate equivalent to the crystal orientation rate obtained when Ni plating is applied to the Cu foil cannot be obtained.

Embodiment 2

An intermediate layer ($CeO_2$/YSZ/$CeO_2$) and an oxide superconducting body layer (RE(1)Ba(2)Cu(3)O(7-δ);

RE=Y, Gd, Ho or the like) having a thickness of 1.2 μm are formed on various metal laminated substrate tapes for an oxide superconducting wire manufactured by the manufacturing method of the present invention and, thereafter, an Ag protective film is formed on the oxide superconducting body layer thus completing the oxide superconducting wire.

Table 3 shows results of measurements of superconductive properties of oxide superconducting wires obtained by the embodiment 2 and having a length of 15 cm and hysteresis generated by saturated magnetization which becomes an index of an AC loss in a state where the intermediate layer is formed.

TABLE 3

| Embodiment comparison example | Sample | Ni thickness (μm) | Surface roughness Ra (nm) | Yield stress (MPa) | Crystal current density (MA/cm$^2$) | Hysteresis (J/cm$^3$) |
|---|---|---|---|---|---|---|
| Embodiment 2-1 | Ni/SUS316L Lamination plate constitution | 0.7 | 70 | 480 | 1.1 | — |
| Embodiment 2-2 | | 1.0 | 70 | 480 | 1.1 | 52 |
| Embodiment 2-3 | Ni having thickness of X μm | 1.0 | 30 | 480 | 2.2 | 52 |
| Embodiment 2-4 | | 1.0 | 20 | 480 | 2.5 | 52 |
| Embodiment 2-5 | Cu foil having thickness of 18 μm SUS316L plate having thickness of 100 μm | 3.0 | 20 | 480 | 2.5 | — |
| comparison example 2-6 | Ni—5% W alloy having thickness of 100 μm | | 6 | 195 | 2.5 | 1300 |

The following can be understood from Table 3.

All oxide superconducting wires of the embodiment 2 exhibit high strength of 480 MPa or more.

With respect to critical current density under a temperature of 77K which is superconductive property, all oxide superconducting wires of the embodiment 2 exhibit values of 1 MA/cm$^2$ or more.

Hysteresis of the oxide superconducting wires of the embodiment 2 become not more than 1/26 of hysteresis of the Ni-5% W alloy exemplified as the comparison example when the thickness of Ni plating is 1 μm. In the embodiment 2-1, hysteresis of the oxide superconducting wire assumes a value smaller than this value. In the embodiment 2-5, although hysteresis of the oxide superconducting wire becomes slightly larger than this value, the value is sufficiently usable.

INDUSTRIAL APPLICABILITY

The oxide superconducting wire of the present invention possesses all of properties which cannot be obtained by the conventional substrates, that is, the substrate strength, non-magnetic property and the high crystal orientation rate in a well-balanced manner. Further, the oxide superconducting wire of the present invention can be manufactured by making use of a commercially available material. The oxide superconducting wire of the present invention can realize the manufacture of the elongated coil having a large width. Further, the oxide superconducting wire of the present invention can acquire advantageous effects such as a reduction of cost and the enhancement of mass productivity.

Further, the manufacturing method of the present invention is industrially useful as the manufacturing method of a metal laminated substrate for an oxide superconducting wire and an oxide superconducting wire which uses the metal laminated substrate.

EXPLANATION OF SYMBOLS

T1: nonmagnetic metal plate
T2: Cu alloy foil
T3: epitaxial growth film made of Ni alloy
T4: intermediate layer
T5: oxide superconducting body layer
T6: protective film
5A, 5B: metal laminated substrate
10A, 10B: oxide superconducting wire

The invention claimed is:

1. A manufacturing method of a substrate laminated from a non-magnetic metal plate having surfaces and a cold-rolled Cu or a Cu alloy foil having surfaces, the substrate having top and bottom surfaces and being for an oxide superconducting wire, the method comprising:
laminating (1) the non-magnetic metal plate and (2) the cold-rolled metal foil made of Cu or a Cu alloy,
biaxially orienting crystals of the Cu or Cu alloy metal foil laminated to the non-magnetic metal plate by heat treatment at a temperature of 200° C. to 1000° C. after said laminating; and
applying an epitaxial growth film made of Ni or an Ni alloy to a surface of the metal foil,
wherein
heavy working is applied to the whole surface of the Cu or Cu alloy metal foil uniformly at a draft of not less than 90% before said laminating,
activation treatment is applied to both surfaces of the non-magnetic metal plate and the Cu or Cu alloy metal foil before said laminating, and
heavy working is applied to the whole surface of the Cu or Cu alloy metal foil uniformly at a draft of not less than 90% after said laminating.

2. The manufacturing method of a metal laminated substrate for an oxide superconducting wire according to claim 1, wherein the non-magnetic metal plate has a thickness of not less than 0.05 mm and not more than 0.2 mm.

3. The manufacturing method of a metal laminated substrate for an oxide superconducting wire according to claim 1, wherein the cold-rolled metal foil has a thickness of not less than 7 µm and not more than 50 µm.

4. A manufacturing method of an oxide superconducting wire of claim 1,
wherein the Cu alloy foil contains not less than 0.01% and not more than 1% of Ag, Sn, Zn, Zr, O and N in total.

5. The manufacturing method of a metal laminated substrate for an oxide superconducting wire according to claim 1, wherein a film thickness of the Ni alloy is not less than 0.5 µm and not more than 10 µm.

6. The manufacturing method of a metal laminated substrate for an oxide superconducting wire according to claim 1, wherein before the heat treatment, polish treatment is applied to the metal foil such that the surface roughness of a surface of the metal foil becomes not less than 1 nm and not more than 40 nm by Ra.

7. The manufacturing method of a metal laminated substrate for an oxide superconducting wire according to claim 1,
wherein the heat treatment after lamination is performed at a temperature of not less than 600° C. and not more than 900° C.

8. The method of claim 1 wherein said biaxially orienting reaches a crystal orientation rate of at least 99%.

9. The method of claim 1, further comprising shaping the laminate comprising the biaxially orienting crystals of Cu or Cu alloy and the epitaxial growth film thereon into a wire.

\* \* \* \* \*